United States Patent
Lee

(10) Patent No.: US 7,180,811 B2
(45) Date of Patent: Feb. 20, 2007

(54) SEMICONDUCTOR MEMORY DEVICE INFORMING INTERNAL VOLTAGE LEVEL USING READY/BUSY PIN

(75) Inventor: June Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 10/630,434

(22) Filed: Jul. 29, 2003

(65) Prior Publication Data

US 2004/0042319 A1 Mar. 4, 2004

(30) Foreign Application Priority Data

Sep. 3, 2002 (KR) .......................... 10-2002-52730

(51) Int. Cl.
*G11C 7/00* (2006.01)

(52) U.S. Cl. .................. 365/226; 365/191; 365/189.11

(58) Field of Classification Search ........... 365/189.11, 365/189.09, 241, 218, 191, 226
See application file for complete search history.

(56) References Cited

U.S. PATENT DOCUMENTS

| | | | | |
|---|---|---|---|---|
| 4,224,539 A | * | 9/1980 | Musa et al. .................. 327/78 |
| 5,402,380 A | * | 3/1995 | Kumakura et al. ..... 365/185.08 |
| 5,469,387 A | * | 11/1995 | Kim ...................... 365/189.09 |
| 5,768,207 A | * | 6/1998 | Raad et al. .................. 365/226 |
| 6,097,659 A | * | 8/2000 | Kang .......................... 365/226 |
| 6,288,940 B1 | * | 9/2001 | Kawamura ............. 365/185.09 |
| 6,297,993 B1 | | 10/2001 | Chen et al. |
| 6,307,783 B1 | * | 10/2001 | Parker ................... 365/185.21 |
| 6,326,669 B1 | * | 12/2001 | Hwang et al. ............... 257/384 |
| 6,327,194 B1 | * | 12/2001 | Kurihara et al. ....... 365/189.09 |
| 6,400,624 B1 | * | 6/2002 | Parker et al. ................ 365/201 |
| 6,657,903 B2 | * | 12/2003 | Sung ...................... 365/189.09 |
| 6,661,710 B2 | * | 12/2003 | Kwon ................... 365/185.24 |

* cited by examiner

*Primary Examiner*—Thong Q. Le
(74) *Attorney, Agent, or Firm*—Marger Johnson & McCollom, P.C.

(57) ABSTRACT

A semiconductor memory device has a ready/busy pin for detecting a current state of the device. The memory device includes a voltage level detector, a ready/busy driver controller, and a ready/busy driver. The voltage level detector checks if the internal voltage level has reached a predetermined level, and then generates a power-up signal. The ready/busy driver controller generates a busy enable signal in response to the power-up signal. The ready/busy driver provides the busy enable signal to a ready/busy pin by which it is informed that the memory device is in a busy state.

26 Claims, 3 Drawing Sheets

SEMICONDUCTOR MEMORY DEVICE INFORMING INTERNAL VOLTAGE LEVEL USING READY/BUSY PIN

CROSS REFERENCE TO RELATED APPLICATIONS

This application claims priority from Korean Patent Application No. 2002-0052730, filed on Sep. 3, 2002, the contents of which are herein incorporated by reference in their entirety.

BACKGROUND OF THE INVENTION

1. Technical Field of the Invention

This invention relates to semiconductor memory devices and more particularly to non-volatile semiconductor memory devices using a ready/busy pin.

2. Description of the Related Art

In recent years, supply voltages for memory devices have been gradually lowered as integration densities become higher and the scaling-down of semiconductor memory devices continues. Consequently, it is now conventional to lower an external voltage to a predetermined voltage level that properly drives internal circuits of the memory device with the proper electrical conditions.

For the purpose of using the internal voltage into the internal circuits, many semiconductor memory devices, such as DRAM, SRAM, flash EEPROM, etc., have internal voltage generators therein. The semiconductor devices embedded within mobile systems conventionally include their own internal voltage generators in order to reduce the operative power consumption of the systems and to set appropriate levels of internal voltages lower than the external voltages.

It has thus become more important for memory devices embedded in mobile systems to operate with lower voltages and promote lengthening of battery life. The internal voltage generator typically brings a higher external voltage level down to a lower predetermined voltage level in a required time. In a basic procedure for settling the internal voltage, an external voltage is compared with a reference voltage to regularly establish a level of the internal voltage. The internal voltage may retain a constant voltage level by itself in a standby mode (or a sleep mode) of the device because there are no power transitions (or variations). But, when the memory device returns to an active mode from the standby mode, the internal voltage may accidentally drop or fluctuate because of dynamic power transitions and a multiplicity of operations by a number of internal circuit elements. Such variations of the internal voltage level may cause operational malfunctions.

Meanwhile, the power-up speed (or a setup time) of the internal voltage may be different from that of the external voltage in the internal voltage generator. Namely, the power-up speed of the external voltage is faster than that of the internal voltage, i.e., the internal voltage $V_{INT}$ has not reached its required voltage level yet even when the external voltage has already been set to an operable level. During this time, the internal voltage is in an unstable condition.

Referring to FIG. 1, at a time A, an external voltage $V_{EXT}$ has risen above a predetermined voltage $V_{DET}$ to a voltage level where the memory device is operable in a stable condition, hereinafter referred to as the "operation voltage level". Although at time A the external voltage has surpassed the voltage $V_{DET}$, an internal voltage $V_{INT}$ has not yet reached the operation voltage level $V_{DET}$ yet. The internal voltage $V_{INT}$ arrives at the operation voltage level $V_{DET}$ at a time B after a term TAB from the time A.

If a system simply checks a level of the external voltage VEXT at the time A where the external voltage VEXT is saturated, and then renders a memory device operable based only upon the external voltage VEXT, the memory device may be conditioned with functional instability because the internal voltage $V_{INT}$ has not yet reached the operation voltage level $V_{DET}$.

Accordingly, for memory devices, the system needs to check whether the internal voltage $V_{INT}$ has reached the operation level or not.

Embodiments of the invention address these and other limitations of the conventional art.

SUMMARY OF THE INVENTION

Embodiments of the invention provide a memory device capable of checking a state of an internal voltage level. Embodiments of the invention also provide a memory capable of preventing malfunctions due to unstable power-up conditions of an internal voltage.

An embodiment of the invention has a ready/busy pin for detecting a current state of the device includes a voltage level detector, a ready/busy driver controller, and a ready/busy driver. The voltage level detector checks if the internal voltage level has reached a predetermined level, and if not, generates a power-up signal. The ready/busy driver controller generates a busy enable signal in response to the power-up signal. The ready/busy driver provides the busy enable signal to a ready/busy pin by which it is informed that the memory device is in a busy state.

DETAILED DESCRIPTION OF THE INVENTION

Objects and advantages of the invention will become more readily apparent from the detailed description given hereinafter. However, it should be understood that the detailed description and specific example, while indicating a preferred embodiments of the invention, are given by way of illustration only, since various changes and modifications within the spirit and scope of the invention will become apparent to those skilled in the art from this detailed description. With reference to the accompanying drawings, a flash memory device according to an embodiment of the invention will now be described.

An embodiment of the invention is applicable to a semiconductor memory, e.g., a flash memory, that uses an internal voltage converted from an external voltage. The flash memory, as nonvolatile memory, is more adaptable to a battery-powered mobile system that requires low power consumption.

Figure 1:
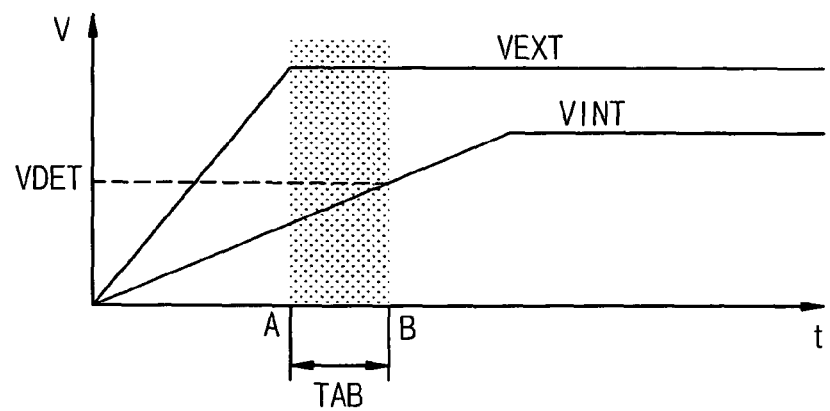
FIG. 1 is a voltage diagram illustrating general power-up features of external and internal voltages of a semiconductor memory device.
Figure 2:
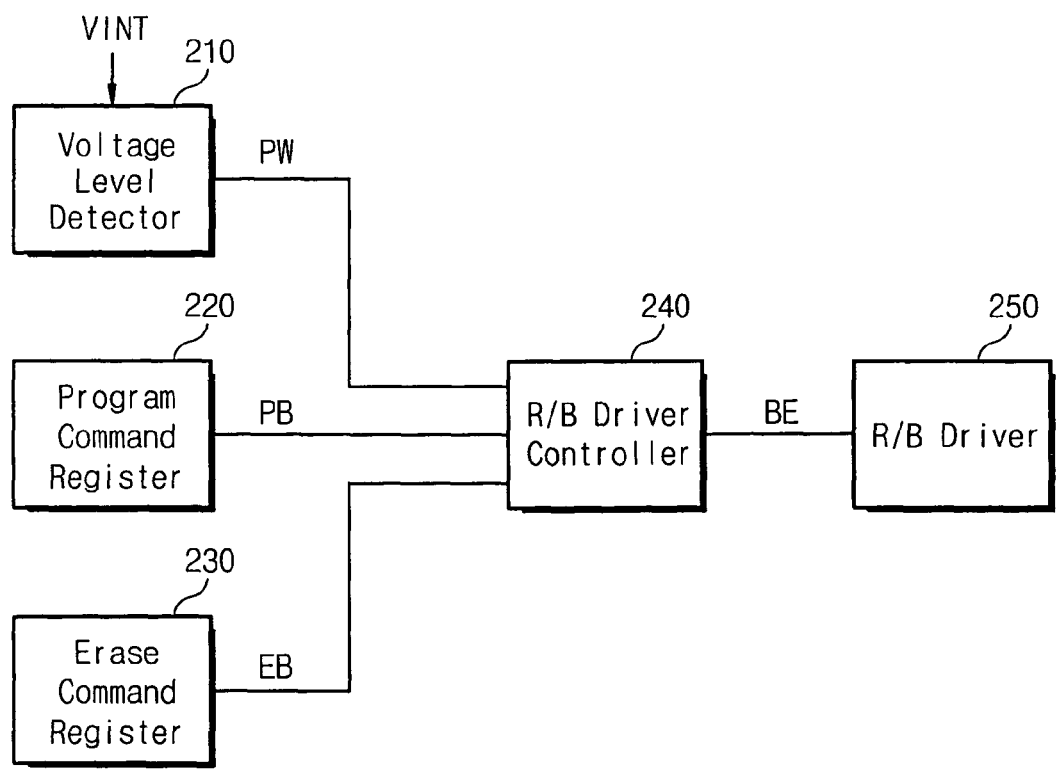
FIG. 2 is a block diagram illustrating a functional construction of a flash memory device according to an embodiment of the invention.

FIG. 2 is a block diagram illustrating a functional construction of a flash memory device according to an embodiment of the invention. Referring to FIG. 2, the flash memory device includes a voltage level detector 210, a program command register 220, an erase command register 230, a ready/busy driver controller 240, and a ready/busy driver 250.

The voltage level detector 210 senses the internal voltage VINT and generates a power-up signal PW while the internal voltage VINT is lower than an operation voltage level $V_{DET}$ that is a minimum voltage required to operate the device. The program command register 220 generates the program busy signal PB for indicating that memory cells of the flash memory device are being programmed therein. The erase command register 230 generates the erase busy signal EB while the memory cells of the flash memory device are being erased therein.

The ready/busy driver controller 240 generates the busy enable signal BE when the power-up signal PW, the program busy signal PB, or the erase busy signal EB is at a logic high state. The ready/busy driver 250 sets a state of a ready/busy pin to a busy state in response to the busy enable signal BE.

Figure 3:
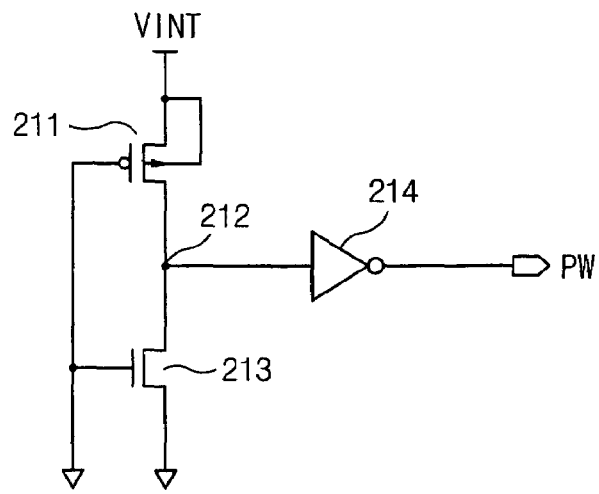
FIG. 3 is a circuit diagram illustrating the voltage level detector of FIG. 2.

FIG. 3 illustrates the voltage level detector 210 in detail. Referring to FIG. 3, the voltage level detector 210 is formed of a PMOS transistor 211 connected between the internal voltage VINT and a detection node 212, an NMOS transistor 213 connected between the detection node 212 and a ground voltage, and an inverter 214 converting a voltage at the detection node 212 to the power-up signal PW. Gates of the transistors 211 and 213 are coupled to the ground voltage.

During a power-up period, the power-up signal PW maintains a high level until the internal voltage VINT rises from 0V up to a predetermined level that is the trigger voltage for the inverter 214. When the level of the power-up signal PW changes from a high level to a low level, the power-up operation is complete. In other words, if the internal voltage VINT rises over the trigger voltage of the inverter 214, the voltage level detector 210 generates the power-up signal PW at a low level because the detection node 212 goes to a high level.

Figure 4:
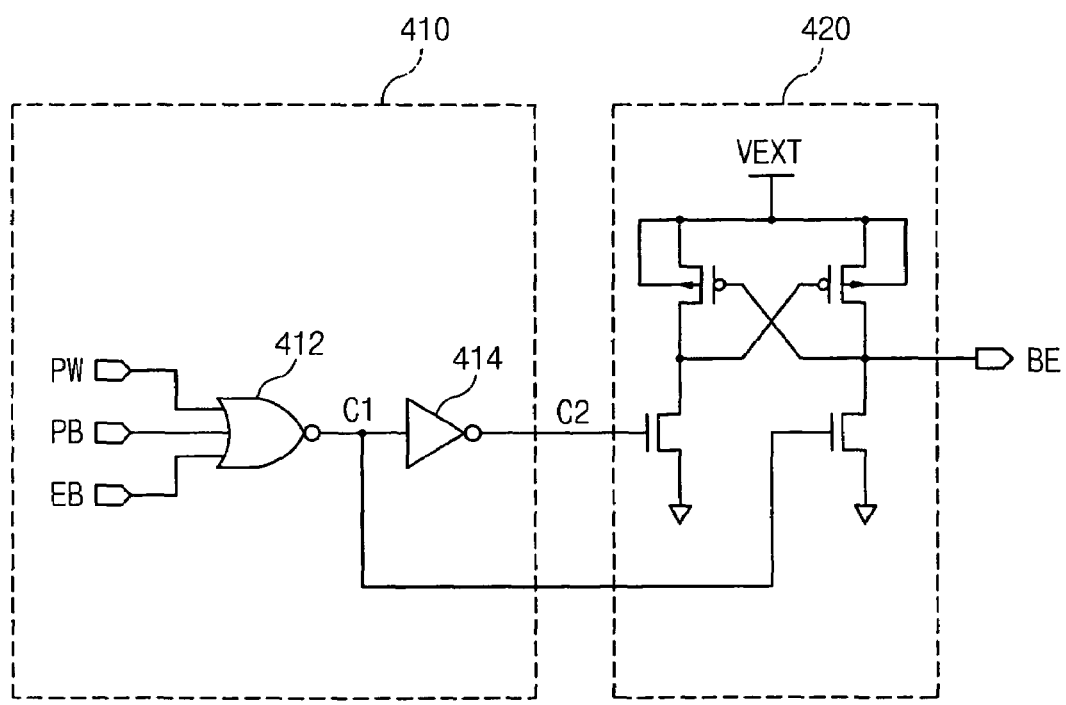
FIG. 4 is a circuit diagram illustrating the ready/busy driver controller of FIG. 2.

FIG. 4 shows a circuit of the ready/busy driver controller 240. In FIG. 4, the ready/busy driver controller 240 includes a control signal generator 410 and a level shifter 420. The control signal generator 410 is formed of a NOR gate 412 and an inverter 414. The NOR gate 412 receives the power-up signal PW, the program busy signal PB, and the erase busy signal EB and then generates a first control signal C1. The inverter 414 receives the first signal C1 to generate a second control signal C2. The second control signal C2 is generated at a high level when at least one of the power-up signal PW, the program busy signal PB, and the erase busy signal EB is at a high level. When all three input signals to the NOR gate 412 (PW, PB, EB) indicate low levels, the inverter 414 sets the second control signal C2 to a low level.

When the level shifter 420, biased by the external voltage VEXT, receives the first control signal C1 at a low level and the second control signal C2 at a high level, it generates the busy enable signal BE at a high level. The busy enable signal BE is at a low level when the first and second control signals, C1 and C2, are at high and low levels, respectively. It may be possible to generate the busy enable signal BE without the level shifter by using the second control signal C2 as the busy enable signal with a level of the external voltage.

Figure 5:
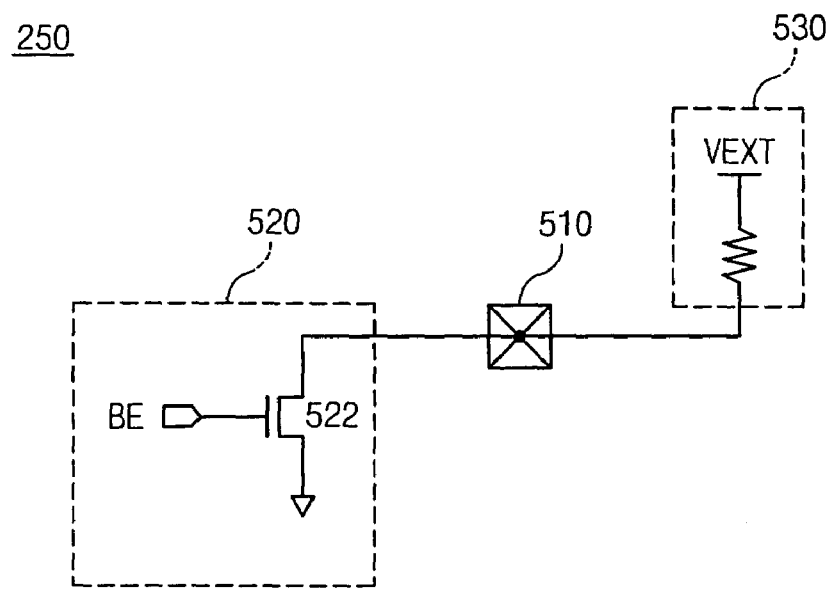
FIG. 5 is a circuit diagram illustrating the ready/busy driver of FIG. 2.

FIG. 5 shows the ready/busy driver 250 in detail. The ready/busy driver 250 includes a ready/busy pin 510, an open drain driver 520 of an NMOS transistor 522, and a pull-up load 530 of a resistor connected between with the external voltage VEXT and the ready/busy pin 510. As the busy enable signal BE goes to a high level, the NMOS transistor 522 of the open drain driver 520 is turned on and then a voltage level at the ready/busy pin 510 goes to a low level. When the busy enable signal BE is at a low level, the NMOS transistor 522 of the open drain driver 520 is turned off and the voltage level of the ready/busy pin 510 rises to a high level because of the pull-up load 530.

Figure 6:
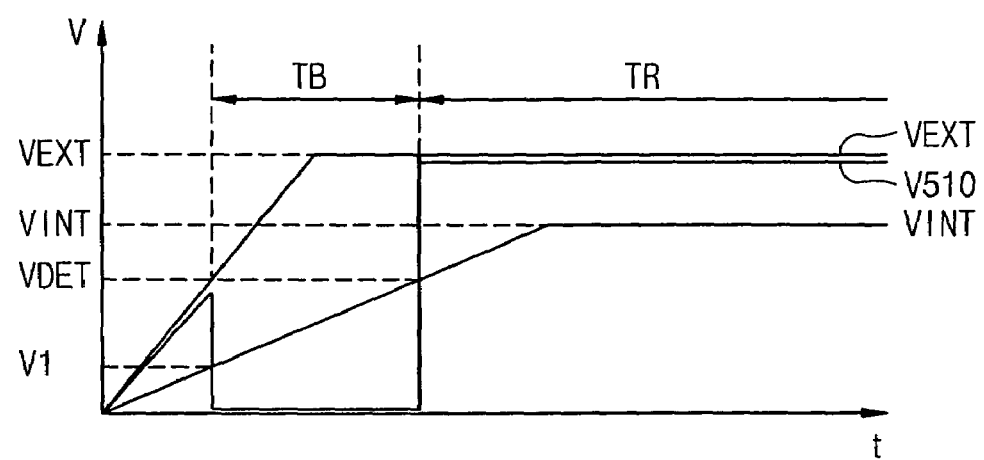
FIG. 6 is a voltage diagram illustrating the operation of a ready/busy pin according to an embodiment of the invention, and the power-up feature of external and internal voltages.

Referring to FIG. 6, when a voltage V510 at the ready/busy pin 510 is at a low level (during term TB), the flash memory device is in a busy state, and the system controller does not access the flash memory device. On the other hand, when the voltage V510 at the ready/busy pin 510 is at a high level (during term TR), the flash memory device is in a ready state and the system controller may access the flash memory device.

According to embodiments of the invention, the system controller does not access the flash memory device when the power-up signal PW is set to a high level or when the ready/busy pin indicates a busy state. With the conventional art, operational malfunctions may occur in the flash memory device because the system controller accesses the memory device regardless of the power-up state of an internal voltage.

As described above, the invention may be embodied in several forms without departing from the spirit or essential characteristics thereof. It should also be understood that the above-described embodiments are not limited by any of the details of the foregoing description, unless otherwise specified, but rather the description should be construed broadly within the spirit and scope of the invention as defined in the appended claims. Therefore all changes and modifications that fall within the metes and bounds of the claims, or equivalencies of such metes and bounds, are intended to be embraced by the appended claims.

The invention claimed is:

1. A semiconductor memory device comprising:
   a voltage level detector configured to sense a voltage and configured to generate a power-up signal while the voltage is less than a minimum voltage required to operate the device;
   a command register configured to generate a command busy signal;
   a ready/busy driver controller configured to generate a busy enable signal in response to the power-up signal and the command busy signal; and
   a ready/busy driver configured to drive a ready/busy signal in response to the busy enable signal.

2. The semiconductor memory device of claim 1, wherein the command register comprises:
   a program command register configured to provide a program busy signal to the ready/busy driver controller; and
   an erase command register configured to provide an erase busy signal to the ready/busy driver controller.

3. The semiconductor memory device of claim 2, wherein the program busy signal indicates that the memory device is in a program mode.

4. The semiconductor memory device of claim 2, wherein the erase busy signal indicates that the memory device is in an erase mode.

5. The semiconductor memory device of claim 1, wherein the ready/busy driver controller comprises:
a control signal generator configured to generate a first and a second control signal in response to the power-up signal; and
a level shifter configured to generate the busy enable signal in response to the first and second control signals.

6. The semiconductor memory device of claim 1, wherein the ready/busy driver comprises:
a ready/busy pin;
an open drain driver configured to set a voltage at the ready/busy pin in response to the busy enable signal; and
a pull up load connected to the ready/busy pin.

7. The semiconductor memory device of claim 6, wherein the memory device is in a busy state during a power-up period when the voltage at the ready/busy pin is at a low state.

8. The semiconductor memory device of claim 7, wherein the memory device is in a ready state after the power-up period.

9. The semiconductor device of claim 1, wherein:
the voltage is an internal voltage generated internal to the semiconductor device; and
the minimum voltage is a minimum internal voltage required to operate the device.

10. A semiconductor memory device comprising:
a voltage level detector configured to generate a power-up signal;
a ready/busy driver controller configured to generate a busy enable signal in response to the power-up signal; and
a ready/busy driver that is responsive to the busy enable signal;
wherein the ready/busy driver controller comprises:
a control signal generator configured to generate a first and a second control signal in response to the power-up signal; and
a level shifter configured to generate the busy enable signal in response to the first and second control signals.

11. A semiconductor memory device comprising:
a voltage level detector configured to generate a power-up signal;
a ready/busy driver controller configured to generate a busy enable signal in response to the power-up signal; and
a ready/busy driver that is responsive to the busy enable signal;
wherein the ready/busy driver controller comprises:
a ready/busy pin;
an open drain driver configured to set a voltage at the ready/busy pin in response to the busy enable signal; and
a pull up load connected to the ready/busy pin.

12. The semiconductor memory device of claim 11, wherein the memory device is in a busy state during a power-up period when the voltage at the ready/busy pin is at a low state.

13. The semiconductor memory device of claim 12, wherein the memory device is in a ready state after the power-up period.

14. A semiconductor memory device comprising:
a voltage level detector configured to generate a power-up signal;
a command register configured to generate a command busy signal;
a ready/busy driver controller configured to generate a busy enable signal in response to the power-up signal and the command busy signal; and
a ready/busy driver configured to drive a ready/busy signal in response to the busy enable signal.

15. The semiconductor memory device of claim 14, wherein the command register comprises:
a program command register configured to provide a program busy signal to the ready/busy driver controller; and
an erase command register configured to provide an erase busy signal to the ready/busy driver controller.

16. The semiconductor memory device of claim 15, wherein the program busy signal indicates that the memory device is in a program mode.

17. The semiconductor memory device of claim 15, wherein the erase busy signal indicates that the memory device is in an erase mode.

18. A method of operating a semiconductor memory device, the semiconductor memory device including a voltage level detector, a ready/busy driver controller, a ready/busy driver, and a command register, the method comprising:
sensing a voltage with the voltage level detector;
generating a power-up signal with the voltage level detector when the voltage is less than a minimum voltage required to operate the semiconductor memory device; and
generating at least one busy signal with the command register, the at least one busy signal indicative of an operational state of the semiconductor memory device; and
generating a busy enable signal with the ready/busy driver controller in response to the power-up signal and the at least one busy signal.

19. The method of operating a semiconductor memory device of claim 18, wherein generating a busy signal comprises generating a program busy signal.

20. The method of operating a semiconductor memory device of claim 18, wherein generating a busy signal comprises generating an erase busy signal.

21. The method of operating a semiconductor memory device of claim 18, further comprising generating a busy enable signal with the ready/busy driver controller, the busy enable signal generated when at least one chosen from the group consisting of the power-up signal and the busy signal is at a logic high state.

22. The method of operating a semiconductor memory device of claim 18, further comprising:
generating an internal voltage internal to the semiconductor device;
wherein generating the power-up signal further comprises generating the power-up signal with the voltage level detector when the internal voltage is less than a minimum internal voltage required to operate the semiconductor memory device.

23. A semiconductor memory device comprising:
a voltage level detector configured to sense a voltage and configured to generate a power-up signal while the voltage is less than a minimum voltage required to operate the device;
a ready/busy driver controller configured to generate a busy enable signal in response to the power-up signal, and including:

a control signal generator configured to generate a first and a second control signal in response to the power-up signal; and a level shifter configured to generate the busy enable signal in response to the first and second control signals;

a ready/busy driver that is responsive to the busy enable signal; and a command register coupled to an input of the ready/busy driver controller.

24. A semiconductor memory device comprising:

a voltage level detector configured to sense a voltage and configured to generate a power-up signal while the voltage is less than a minimum voltage required to operate the device;

a ready/busy driver controller configured to generate a busy enable signal in response to the power-up signal;

a ready/busy driver that is responsive to the busy enable signal, and includes:

a ready/busy pin;

an open drain driver configured to set a voltage at the ready/busy pin in response to the busy enable signal; and a pull up load connected to the ready/busy pin; and a command register coupled to an input of the ready/busy driver controller.

25. The semiconductor memory device of claim 24, wherein the memory device is in a busy state during a power-up period when the voltage at the ready/busy pin is at a low state.

26. The semiconductor memory device of claim 25, wherein the memory device is in a ready state after the power-up period.

* * * * *